United States Patent
Kim (10) Patent No.: US 9,620,192 B2
(45) Date of Patent: Apr. 11, 2017

(54) SYNCHRONIZING REFRESH CONTROL CIRCUIT FOR A PLURALITY OF SLICES AND SEMICONDUCTOR APPARATUS USING THE SAME

(71) Applicant: SK hynix Inc., Icheon-si, Gyeonggi-do (KR)

(72) Inventor: Chang Hyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/567,773

(22) Filed: Dec. 11, 2014

(65) Prior Publication Data

US 2016/0071570 A1   Mar. 10, 2016

(30) Foreign Application Priority Data

Sep. 5, 2014   (KR) .................. 10-2014-0118849

(51) Int. Cl.
    G11C 11/406   (2006.01)
(52) U.S. Cl.
    CPC ... *G11C 11/40611* (2013.01); *G11C 11/40615* (2013.01); *G11C 11/40618* (2013.01)
(58) Field of Classification Search
    CPC ............ G11C 11/406; G11C 11/40615; G11C 11/40618
    USPC .......................................................... 365/222
    See application file for complete search history.

(56) References Cited

U.S. PATENT DOCUMENTS

| 8,559,258 | B1* | 10/2013 | Stephens, Jr. ..... | G11C 11/40615 365/211 |
| 2009/0268539 | A1* | 10/2009 | Ruckerbauer ......... | G11C 11/406 365/222 |
| 2012/0263003 | A1* | 10/2012 | Sakakibara ....... | G11C 11/40615 365/222 |
| 2014/0355370 | A1* | 12/2014 | Kim .................. | G11C 11/40615 365/222 |

FOREIGN PATENT DOCUMENTS

KR   101175248 B1   8/2012

* cited by examiner

*Primary Examiner* — Son Dinh
*Assistant Examiner* — Jerome Leboeuf
(74) *Attorney, Agent, or Firm* — William Park & Associates Ltd.

(57) ABSTRACT

A semiconductor apparatus with a plurality of slices electrically coupled through through electrodes. Any one slice of the plurality of slices may be configured to generate a refresh cycle signal in response to a refresh command, and transmit the refresh cycle signal to the other slices through the through electrodes. The other slices may be configured to perform refresh operations in synchronization with the refresh cycle signal.

13 Claims, 5 Drawing Sheets

SYNCHRONIZING REFRESH CONTROL CIRCUIT FOR A PLURALITY OF SLICES AND SEMICONDUCTOR APPARATUS USING THE SAME

CROSS-REFERENCES TO RELATED APPLICATION

The present application claims priority under 35 U.S.C. §119(a) to Korean application number 10-2014-0118849, filed on Sep. 5, 2014, in the Korean Intellectual Property Office, which is incorporated herein by reference in its entirety.

BACKGROUND

1. Technical Field

Various embodiments generally relate to a semiconductor circuit, and more particularly, to a refresh control circuit and a semiconductor apparatus using the same.

2. Related Art

A semiconductor apparatus may have a three-dimensional structure. The three-dimensional structure may be realized with a plurality of memory slices (hereinafter, referred to as "slices") that are stacked. Implementing slices is one of the methods used for increasing the degree of integration within a semiconductor apparatus.

An important factor that influences the operational performance of semiconductor apparatuses having a three-dimensional structure includes reducing peak current in a refresh operation.

In a conventional semiconductor apparatus, the operation of an oscillator for generating a refresh cycle is needed in each of a plurality of slices.

It is ideal that the oscillators of the plurality of slices be designed to have the same refresh cycle. However, it is almost impossible for the oscillators of the plurality of slices to have the same refresh cycle due to variations in PVT (process, voltage and temperature).

Therefore, the conventional semiconductor apparatus may encounter problems whereby the peak current is likely to increase in a refresh operation.

SUMMARY

In an embodiment, a refresh control circuit may be configured to generate a refresh start signal in response to a pulse corresponding to a turn of the pulse among pulses of a refresh cycle signal. The refresh cycle signal may be internally generated or may be received from an exterior of the refresh control circuit.

In an embodiment, a refresh control circuit may include an oscillator configured to generate oscillation signals in response to slice type distinguishment signals. The refresh control circuit may include a multiplexing block configured to generate a refresh mode distinguishment signal in response to a stack mode distinguishment signal. The refresh control circuit may include a control block coupled to the oscillator and the multiplexing block, and configured to output a refresh cycle signal in response to a refresh command and the oscillation signals, and generate a refresh start signal in response to slice identities (IDs) and the refresh cycle signal.

In an embodiment, a semiconductor apparatus may include a plurality of slices electrically coupled through through electrodes. Any one slice of the plurality of slices may be configured to generate a refresh cycle signal in response to a refresh command, and transmit the refresh cycle signal to the other slices through the through electrodes. The other slices may be configured to perform refresh operations in synchronization with the refresh cycle signal.

DETAILED DESCRIPTION

Hereinafter, a refresh control circuit and a semiconductor apparatus using the same will be described below with reference to the accompanying drawings through various examples of embodiments.

Various embodiments may be directed to a refresh control circuit. The refresh control circuit may be capable of reducing peak current in a refresh operation and a semiconductor apparatus using the same.

Figure 1:
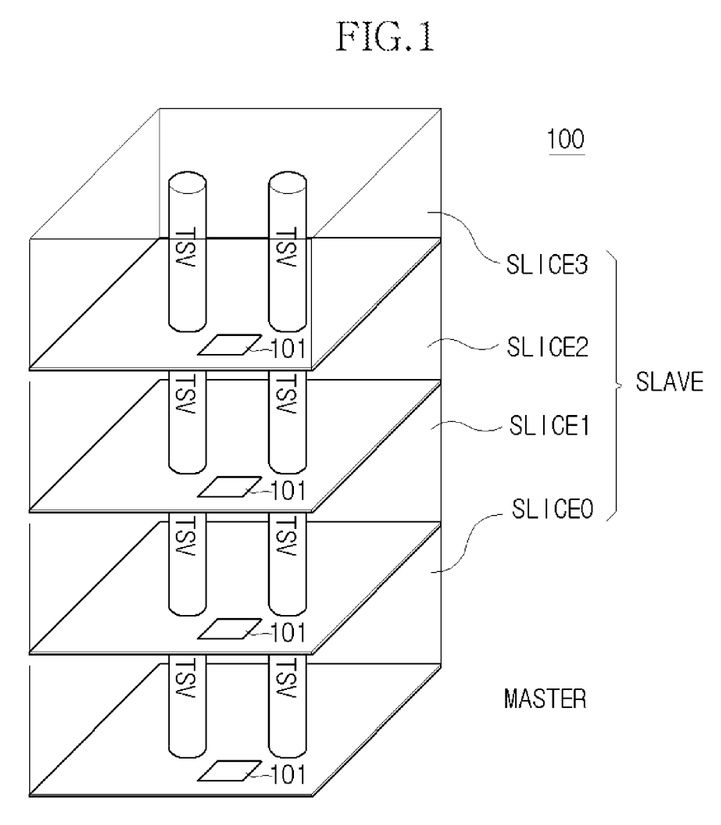
FIG. 1 is a diagram illustrating a representation of an example of the configuration of a semiconductor apparatus in accordance with an embodiment.

Referring to FIG. 1, a semiconductor apparatus 100 in accordance with an embodiment may include a plurality of memory slices (hereinafter, referred to as "slices") SLICE0 to SLICE3.

The plurality of slices SLICE0 to SLICE3 may be configured to be capable of transmitting and receiving signals through through electrodes (for example, through-silicon vias TSV).

The plurality of slices SLICE0 to SLICE3 may be configured to share the signals transmitted and received through the through-silicon vias TSV.

The semiconductor apparatus 100 in accordance with an embodiment may be configured in such a manner that any one (for example, the slice SLICE0) among the plurality of slices SLICE0 to SLICE3 may generate a refresh cycle signal and provide the generated refresh cycle signal to the other slices SLICE1 to SLICE3 through the through-silicon vias TSV and the other slices SLICE1 to SLICE3 may perform refresh operations in synchronization with the refresh cycle signal.

The other slices SLICE1 to SLICE3 may be configured to perform the refresh operations sequentially. The other slices SLICE1 to SLICE3 may be configured to sequentially perform the refresh operations in response to pulses corresponding to the slices SLICE1 to SLICE3 among the pulses of the refresh cycle signal.

Any one, for example, the lowermost slice SLICE0, of the plurality of slices SLICE0 to SLICE3 may be a master slice, and the remaining slices SLICE1 to SLICE3 may be slave slices.

Each of the plurality of slices SLICE0 to SLICE3 may include a refresh control circuit 101.

The master slice SLICE0 may generate the refresh cycle signal by using an oscillation signal. The oscillation signal may be generated by an oscillator.

Figure 2:
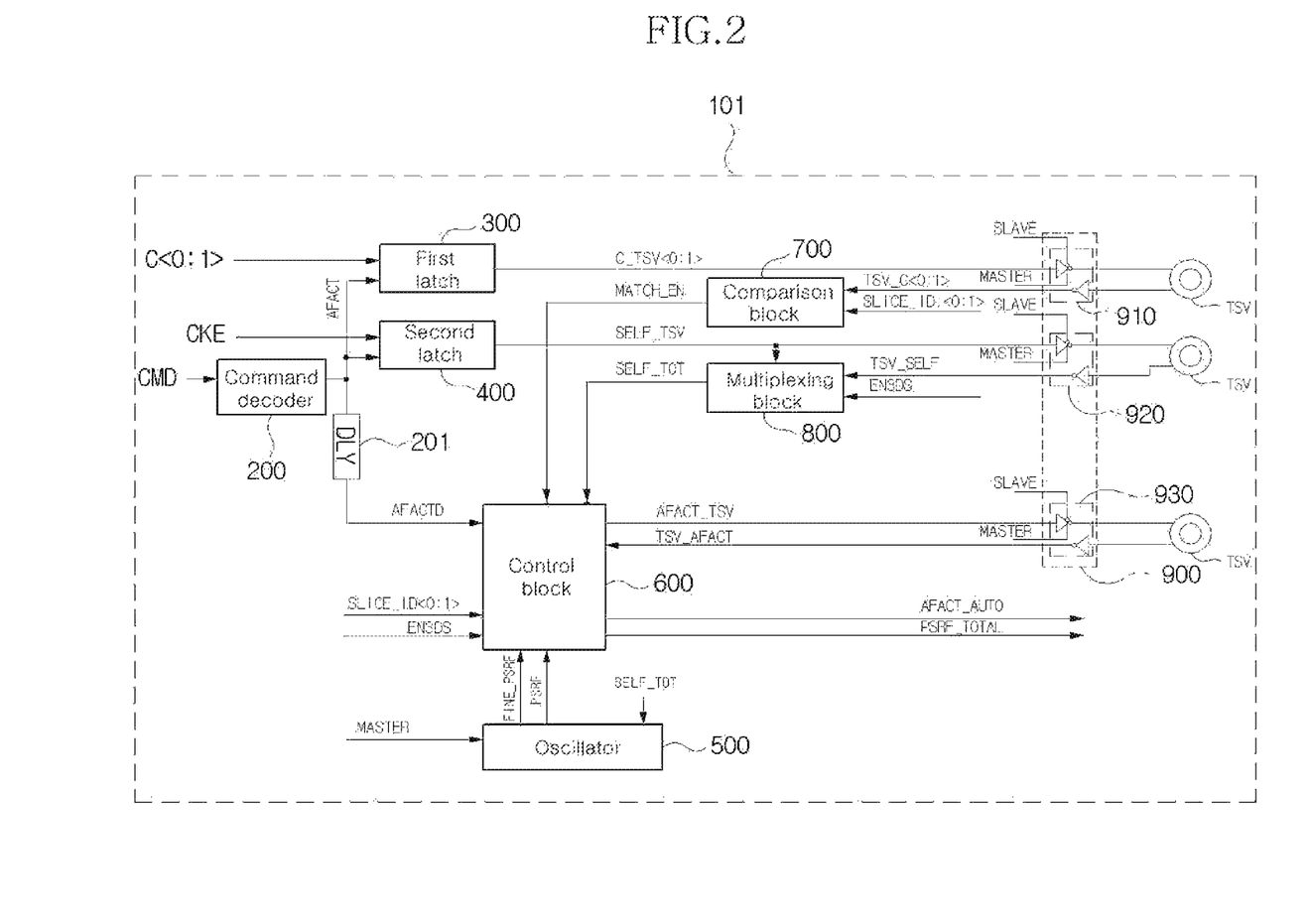
FIG. 2 is a diagram illustrating a representation of an example of the internal configuration of the refresh control circuit illustrated in FIG. 1.

Referring to FIG. 2, the refresh control circuit 101 may include a command decoder 200, a delay (DLY) 201, and a first latch 300. The refresh control circuit 101 may include a second latch 400, an oscillator 500, and a control block 600. The refresh control circuit 101 may include a comparison block 700, a multiplexing block 800, and a transmission/reception block 900.

The command decoder 200 may be configured to generate a refresh pulse AFACT in response to a command CMD. The command CMD is defined with a refresh command.

The delay 201 may be configured to delay the refresh pulse AFACT by a predetermined time and generate a delayed refresh pulse AFACTD.

The first latch 300 may be configured to latch external slice select signals C<0:1> provided from an exterior of the semiconductor apparatus 100, according to the refresh pulse AFACT, and generate first slice addresses C_TSV<0:1>.

The external slice select signals C<0:1> are signals for selecting any one among the plurality of slices SLICE0 to SLICE3 (see FIG. 1).

Although the first slice addresses C_TSV<0:1> and second slice addresses TSV_C<0:1>, to be described later, are the same signals, they are designated differently from each other to distinguish transmission and reception sides.

The first slice addresses C_TSV<0:1> are addresses transmitted by the master slice SLICE0 to the slave slices SLICE1 to SLICE3 through the through-silicon vias TSV.

The second slice addresses TSV_C<0:1> are addresses that are a result of the slave slices SLICE1 to SLICE3 receiving the addresses transmitted by the master slice SLICE0 through the through-silicon vias TSV.

The second latch 400 may be configured to latch the refresh pulse AFACT according to a clock enable signal CKE, and generate a first self refresh pulse SELF_TSV.

Although the first self refresh pulse SELF_TSV and a second self refresh pulse TSV_SELF, to be described later, are the same signals, they are designated differently from each other to distinguish transmission and reception sides.

The first self refresh pulse SELF_TSV is a signal generated by the master slice SLICE0 and is transmitted to the slave slices SLICE1 to SLICE3 through the through-silicon vias TSV.

The second self refresh pulse TSV_SELF is a signal that is a result of the slave slices SLICE1 to SLICE3 receiving the signal transmitted by the master slice SLICE0 through the through-silicon vias TSV.

As the exterior of the semiconductor apparatus 100, for example, a memory controller (not shown) generates the clock enable signal CKE to a logic low and the refresh pulse AFACT is generated through the command CMD, the semiconductor apparatus 100 may be designated to perform a self refresh operation.

The oscillator 500 may be configured to generate a first oscillation signal PSRF and a second oscillation signal FINE_PSRF. The first oscillation signal PSRF and a second oscillation signal FINE_PSRF may be generated in response to a slice type distinguishment signal MASTER of slice type distinguishment signals MASTER and SLAVE and a refresh mode distinguishment signal SELF_TOT.

The second oscillation signal FINE_PSRF may have a shorter cycle when compared to the first oscillation signal PSRF, for example, ¼ or less in the examples where the semiconductor apparatus 100 is configured by the 4 slices SLICE0 to SLICE3.

The first oscillation signal PSRF is a signal for defining a refresh cycle, and the second oscillation signal FINE_PSRF is a signal for defining the additional refresh cycle of slices for which refresh has not been first performed, among stacked slices.

It will be described as an example in an embodiment that, among the plurality of slices SLICE0 to SLICE3, the slice SLICE0 is a master slice and the remaining slices SLICE1 to SLICE3 are slave to slices.

The slice type distinguishment signals MASTER and SLAVE are signals for defining whether a slice is the master slice or not.

The slice type distinguishment signals MASTER and SLAVE may be stored in the master slice SLICE0 as a logic high and a logic low, respectively, that is, levels that define a master.

The slice type distinguishment signals MASTER and SLAVE may be stored in the slave slices SLICE1 to SLICE3 as a logic low and a logic high, respectively, that is, levels that define a slave.

The refresh mode distinguishment signal SELF_TOT is a signal for distinguishing self refresh and auto refresh.

In an embodiment, the oscillator 500 may operate in only one of the slices, for example, the master slice SLICE0, among the plurality of slices SLICE0 to SLICE3.

The oscillator 500 may generate the first oscillation signal PSRF and the second oscillation signal FINE_PSRF. The first oscillation signal PSRF and the second oscillation signal FINE_PSRF may be generated in response to the refresh mode distinguishment signal SELF_TOT in the examples where the slice type distinguishment signal MASTER of the slice type distinguishment signals MASTER and SLAVE is the logic high.

The operation of the oscillator 500 for generating the first oscillation signal PSRF and the second oscillation signal FINE_PSRF is interrupted in the examples where the slice type distinguishment signal MASTER of the slice type distinguishment signals MASTER and SLAVE is the logic low.

The transmission/reception block 900 may include first to third transmission/reception units 910 to 930.

Each of the first to third transmission/reception units 910 to 930 may be configured to perform signal transmission in response to the slice type distinguishment signals MASTER and SLAVE.

In the master slice SLICE0, since the slice type distinguishment signals MASTER and SLAVE are the logic high and the logic low, respectively, the signal transmission function of the transmission/reception block 900 may be enabled.

In each of the slave slices SLICE1 to SLICE3, since the slice type distinguishment signals MASTER and SLAVE are the logic low and the logic high, respectively, the signal transmission function of the transmission/reception block 900 may be disabled.

The first to third transmission/reception units 910 to 930 may be configured to transmit the first slice addresses C_TSV<0:1>, the first self refresh pulse SELF_TSV and a first refresh cycle signal AFACT_TSV to the through-silicon vias TSV.

The first to third transmission/reception units 910 to 930 may be configured to receive the second slice addresses TSV_C<0:1>, the second self refresh pulse TSV_SELF and a second refresh cycle signal TSV_AFACT from the through-silicon vias TSV.

Although the first refresh cycle signal AFACT_TSV and the second refresh cycle signal TSV_AFACT are the same signals, they are designated differently from each other to distinguish transmission and reception sides.

The first refresh cycle signal AFACT_TSV is a signal generated by the master slice SLICE0 and is transmitted to the slave slices SLICE1 to SLICE3 through the through-silicon vias TSV.

The second refresh cycle signal TSV_AFACT is a signal that is a result of the slave slices SLICE1 to SLICE3 receiving the signal transmitted by the master slice SLICE0 through the through-silicon vias TSV.

The comparison block 700 may be configured to enable a slice matching signal MATCH_EN when the second slice addresses TSV_C<0:1> and slice identities (IDs) SLICE_ID<0:1> correspond to each other.

The slice IDs SLICE_ID<0:1> are generated in such a manner that the stacking turns of the plurality of respective slices SLICE0 to SLICE3 are encoded to match the external slice select signals C<0:1> and the values thereof are stored in the plurality of respective slices SLICE0 to SLICE3.

The slice IDs SLICE_ID<0:1> may be stored in such a manner that, for example, the lowermost master slice SLICE0 corresponds to '00' and the upper slave slices SLICE1 to SLICE3 respectively correspond to '01', '10' and '11'.

The multiplexing block 800 may be configured to select the second self refresh pulse TSV_SELF or the first self refresh pulse SELF_TSV according to a stack mode distinguishment signal EN3DS, and output the refresh mode distinguishment signal SELF_TOT.

The stack mode distinguishment signal EN3DS is a signal for defining whether a corresponding slice is one among a plurality of stacked slices.

If the stack mode distinguishment signal EN3DS is a logic high that defines the stacked state of a corresponding slice, the second self refresh pulse TSV_SELF transmitted from another slice may be selected and outputted as the refresh mode distinguishment signal SELF_TOT.

If the stack mode distinguishment signal EN3DS is a logic low that defines the non-stacked state of a corresponding slice, the first self refresh pulse SELF_TSV generated by the corresponding slice itself may be selected and outputted as the refresh mode distinguishment signal SELF_TOT.

In the example of the master slice SLICE0, the first self refresh pulse SELF_TSV may be transmitted to the through-silicon vias TSV and may also be received through the through-silicon vias TSV.

The control block 600 may be configured to output the first refresh cycle signal AFACT_TSV in response to a refresh command and an oscillation signal, and generate a refresh start signal in response to the slice IDs SLICE_ID<0:1> and the second refresh cycle signal TSV_AFACT.

The control block 600 may use the delayed refresh pulse AFACTD as the refresh command.

The control block 600 may use the delayed refresh pulse AFACTD generated by delaying the refresh pulse AFACT, to secure a timing margin for internal signal processing.

The oscillation signal may include the first oscillation signal PSRF and the second oscillation signal FINE_PSRF.

The refresh start signal may include an auto refresh start signal AFACT_AUTO and a self refresh start signal PSRF_TOTAL.

The control block 600 may be configured to generate the first refresh cycle signal AFACT_TSV, the auto refresh start signal AFACT_AUTO and the self refresh start signal PSRF_TOTAL. The first refresh cycle signal AFACT_TSV, the auto refresh start signal AFACT_AUTO and the self refresh start signal PSRF_TOTAL may be generated in response to the delayed refresh pulse AFACTD, the slice IDs SLICE_ID<0:1>, and the stack mode distinguishment signal EN3DS. Also, the first refresh cycle signal AFACT_TSV, the auto refresh start signal AFACT_AUTO and the self refresh start signal PSRF_TOTAL may be generated in response to the slice matching signal MATCH_EN, the refresh mode distinguishment signal SELF_TOT, and the second refresh cycle signal TSV_AFACT. Also, the first refresh cycle signal AFACT_TSV, the auto refresh start signal AFACT_AUTO and the self refresh start signal PSRF_TOTAL may be generated in response to the first oscillation signal PSRF and the second oscillation signal FINE_PSRF.

In the examples where the above-described refresh control circuit 101 of FIG. 2 is included in the master slice SLICE0, the refresh control circuit 101 may transmit the first slice addresses C_TSV<0:1>, the first self refresh pulse SELF_TSV and the first refresh cycle signal AFACT_TSV to the slave slices SLICE1 to SLICE3, and the oscillator 500 may be activated.

In the examples where the refresh control circuit 101 is included in each of the slave slices SLICE1 to SLICE3, the refresh control circuit 101 is provided with the second slice addresses TSV_C<0:1>, the second self refresh pulse TSV_SELF and the second refresh cycle signal TSV_AFACT from the master slice SLICE0, and the oscillator 500 is deactivated.

Figure 3:
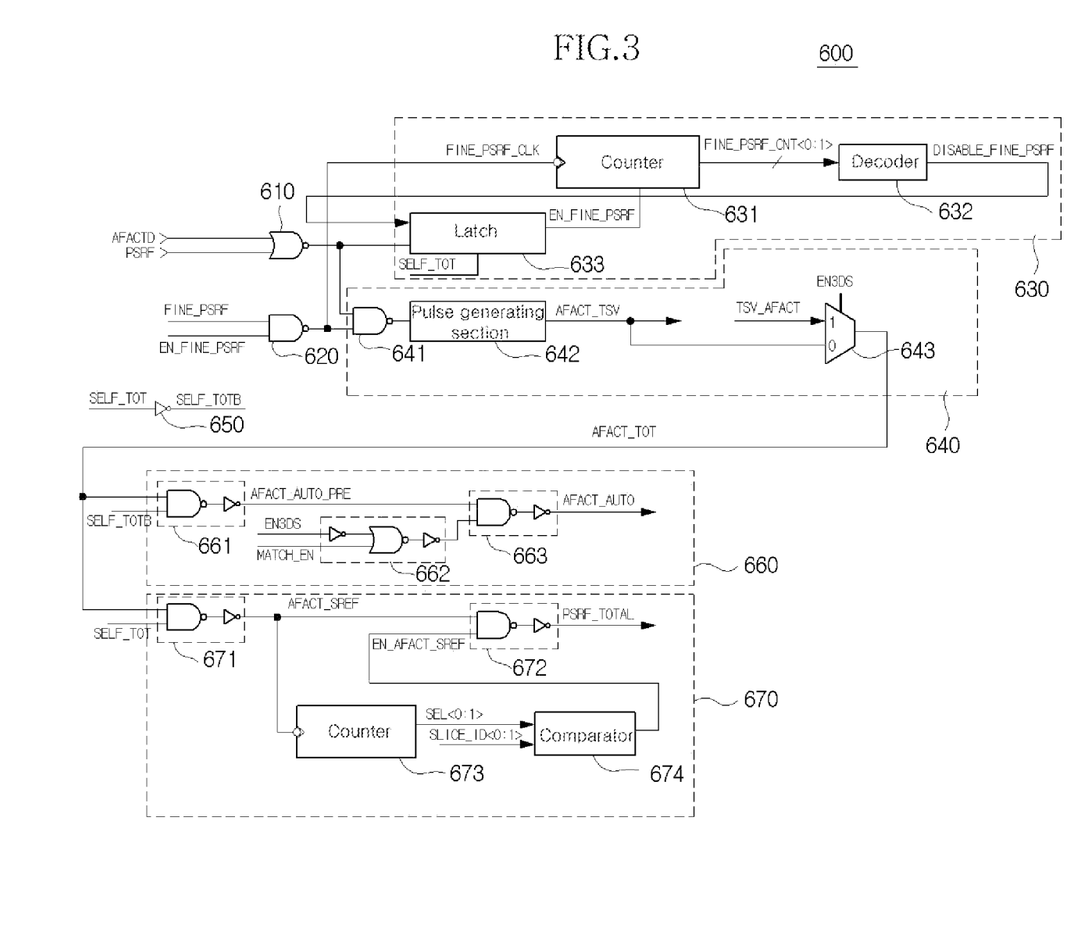
FIG. 3 is a diagram illustrating a representation of an example of the internal configuration of the control block illustrated in FIG. 2.

Referring to FIG. 3, the control block 600 may include a first signal combination unit 610, a second signal combination unit 620, and an oscillation enable signal generation unit 630. The control block 600 may include a refresh cycle signal generation unit 640, an inverter 650, an auto refresh start signal generation unit 660, and a self refresh start signal generation unit 670.

The first signal combination unit 610 may be configured to NOR or perform a NOR logic function on the delayed refresh pulse AFACTD and the first oscillation signal PSRF, and output a resultant signal.

The second signal combination unit 620 may be configured to NAND or perform a NAND logic function on the second oscillation signal FINE_PSRF and an oscillation enable signal EN_FINE_PSRF, and generate an output signal FINE_PSRF_CLK.

The oscillation enable signal generation unit 630 may be configured to generate the oscillation enable signal EN_FINE_PSRF. The oscillation enable signal EN_FINE_PSRF may be generated in response to the output of the first signal combination unit 610, the output of the second signal combination unit 620 and the refresh mode distinguishment signal SELF_TOT.

The oscillation enable signal generation unit 630 may include a counter 631, a decoder 632, and a latch 633.

The counter 631 may be configured to store a value that results from counting the output signal FINE_PSRF_CLK of the second signal combination unit 620. The counter 632 may output the stored value as oscillation pulse count signals FINE_PSRF_CNT<0:1>.

The decoder 632 may be configured to generate an oscillation disable signal DISABLE_FINE_PSRF. The oscillation disable signal DISABLE_FINE_PSRF may be generated when the oscillation pulse count signals FINE_PSRF_CNT<0:1> reach preset values.

The latch 633 may enable the oscillation enable signal EN_FINE_PSRF. The oscillation enable signal EN_FINE_PSRF may be enabled in response to the refresh mode distinguishment signal SELF_TOT and the output of the first signal combination unit 610.

The latch 633 may be configured to disable the oscillation enable signal EN_FINE_PSRF. The oscillation enable signal EN_FINE_PSRF may be disabled in response to the oscillation disable signal DISABLE_FINE_PSRF.

The latch 633 may be configured to enable the oscillation enable signal EN_FINE_PSRF in response to the output of the first signal combination unit 610, in the examples where the refresh mode distinguishment signal SELF_TOT is a logic high, that is, defines a self refresh mode.

The latch 633 may disable the oscillation enable signal EN_FINE_PSRF regardless of the refresh mode distinguishment signal SELF_TOT, in the examples where the oscillation disable signal DISABLE_FINE_PSRF is enabled.

The refresh cycle signal generation unit 640 may be configured to generate the first refresh cycle signal AFACT_TSV in response to the output of the first signal combination unit 610 and the output of the second signal combination unit 620, and output one of the first refresh cycle signal AFACT_TSV and the second refresh cycle signal TSV_AFACT, as an internal refresh cycle signal AFACT_TOT, in response to the stack mode distinguishment signal EN3DS.

The refresh cycle signal generation unit 640 may include a logic circuit, for example, a NAND gate 641. The refresh cycle signal generation unit 640 may include a pulse generating section 642, and a multiplexer 643.

The NAND gate 641 NANDs or performs a NAND logic function on the output of the first signal combination unit 610 and the output of the second signal combination unit 620, and outputs a resultant signal.

The pulse generating section 642 may be configured to generate the first refresh cycle signal AFACT_TSV. The first refresh cycle signal AFACT_TSV may be generated in response to the output of the NAND gate 641.

The multiplexer 643 may be configured to output one of the first refresh cycle signal AFACT_TSV and the second refresh cycle signal TSV_AFACT, as the internal refresh cycle signal AFACT_TOT, in response to the stack mode distinguishment signal EN3DS.

The multiplexer 643 may select the second refresh cycle signal TSV_AFACT transmitted from another slice, when the stack mode distinguishment signal EN3DS is the logic high that defines the stacked state of a corresponding slice, and output the internal refresh cycle signal AFACT_TOT.

The inverter 650 may be configured to invert the refresh mode distinguishment signal SELF_TOT. The inverter 650 may be configured to output an inverted refresh mode distinguishment signal SELF_TOTB.

The refresh mode distinguishment signal SELF_TOT is a signal for distinguishing self refresh and auto refresh.

In the examples where the refresh mode distinguishment signal SELF_TOT is the logic high, the self refresh mode may be defined.

In the examples where the refresh mode distinguishment signal SELF_TOT is a logic low, that is, in the examples where the inverted refresh mode distinguishment signal SELF_TOTB is a logic high, an auto refresh mode may be defined.

The auto refresh start signal generation unit 660 may be configured to generate the auto refresh start signal AFACT_AUTO. The auto refresh start signal AFACT_AUTO may be generated in response to the internal refresh cycle signal AFACT_TOT, the inverted refresh mode distinguishment signal SELF_TOTB, the stack mode distinguishment signal EN3DS and the slice matching signal MATCH_EN.

The auto refresh start signal generation unit 660 may include first to third logic gates 661 to 663.

The first logic gate 661 may be configured to output the internal refresh cycle signal AFACT_TOT as a pre-signal AFACT_AUTO_PRE, when the inverted refresh mode distinguishment signal SELF_TOTB is the logic high (when it is in the auto refresh mode).

The second logic gate 662 may be configured to OR or perform an OR logic function on an inverted signal of the stack mode distinguishment signal EN3DS and the slice matching signal MATCH_EN, and output a resultant signal.

The third logic gate 633 may be configured to AND or perform an AND logic function on the pre-signal AFACT_AUTO_PRE and the output of the second logic gate 662, and generate the auto refresh start signal AFACT_AUTO.

The auto refresh start signal generation unit 660 may output the pre-signal AFACT_AUTO_PRE as the auto refresh start signal AFACT_AUTO, when the stack mode distinguishment signal EN3DS is the logic low in the auto refresh mode (in the examples where a corresponding slice is used in a single mode).

The auto refresh start signal generation unit 660 may output the pre-signal AFACT_AUTO_PRE as the auto refresh start signal AFACT_AUTO, when the stack mode distinguishment signal EN3DS is at the logic high in the auto refresh mode and the slice matching signal MATCH_EN is a logic high (in the examples where a corresponding slice is in a stacked state and is selected using the external slice select signals C<0:1>).

The self refresh start signal generation unit 670 may be configured to generate the self refresh start signal PSRF_TOTAL. The self refresh start signal PSRF_TOTAL may be generated in response to the internal refresh cycle signal AFACT_TOT, the refresh mode distinguishment signal SELF_TOT and the slice IDs SLICE_ID<0:1>.

The self refresh start signal generation unit 670 may include a first logic gate 671, a second logic gate 672, a counter 673, and a comparator 674.

The first logic gate 671 may be configured to output the internal refresh cycle signal AFACT_TOT as a pre-signal AFACT_SREF, when the refresh mode distinguishment signal SELF_TOT is at the logic high (when it is in the self refresh mode).

The counter 673 may be configured to store a value that results from counting the pre-signal AFACT_SREF, and output the stored value as count signals SEL<0:1>.

The count signals SEL<0:1> actually have values that result from counting the internal refresh cycle signal AFACT_TOT.

The comparator 674 may be configured to enable a self refresh enable signal EN_AFACT_SREF, that is, output the self refresh enable signal EN_AFACT_SREF as a logic high, when the count signals SEL<0:1> and the slice IDs SLICE_ID<0:1> correspond to each other.

The fact that the self refresh enable signal EN_AFACT_SREF is enabled means that a pulse of current timing among the pulses of the internal refresh cycle signal AFACT_TOT corresponds to the self refresh start signal generation unit 670.

The second logic gate 672 may be configured to output the pre-signal AFACT_SREF as the self refresh start signal PSRF_TOTAL, when the self refresh enable signal EN_AFACT_SREF is at the logic high.

The self refresh start signal generation unit 670 may output a pulse corresponding to it among the pulses of the internal refresh cycle signal AFACT_TOT as the self refresh start signal PSRF_TOTAL in the self refresh mode.

In an embodiment, to which slice self refresh has been performed and for which slice refresh is to be performed in a current self refresh operation may be stored independently of each other through two counters.

First, the counter 631 of the oscillation enable signal generation unit 630 of FIG. 3 may store the output signal FINE_PSRF_CLK as the pulse of the second oscillation signal FINE_PSRF corresponding to the enable period of the oscillation enable signal EN_FINE_PSRF, that is, the oscillation pulse count signals FINE_PSRF_CNT<0:1> as values resulting from counting the second oscillation signal FINE_PSRF corresponding to the slave slices SLICE1 to SLICE3.

In a state in which self refresh is not completed for all slices, a self refresh exit command may be generated.

Hence, in the example of performing next self refresh, self refresh may be performed from a slice corresponding to the oscillation pulse count signals FINE_PSRF_CNT<0:1> stored in the counter 631.

Next, the counter 373 of the self refresh start signal generation unit 670 of FIG. 3 may determine for which slice refresh is to be performed in a current self refresh operation, through the count signals SEL<0:1>.

Figure 4:
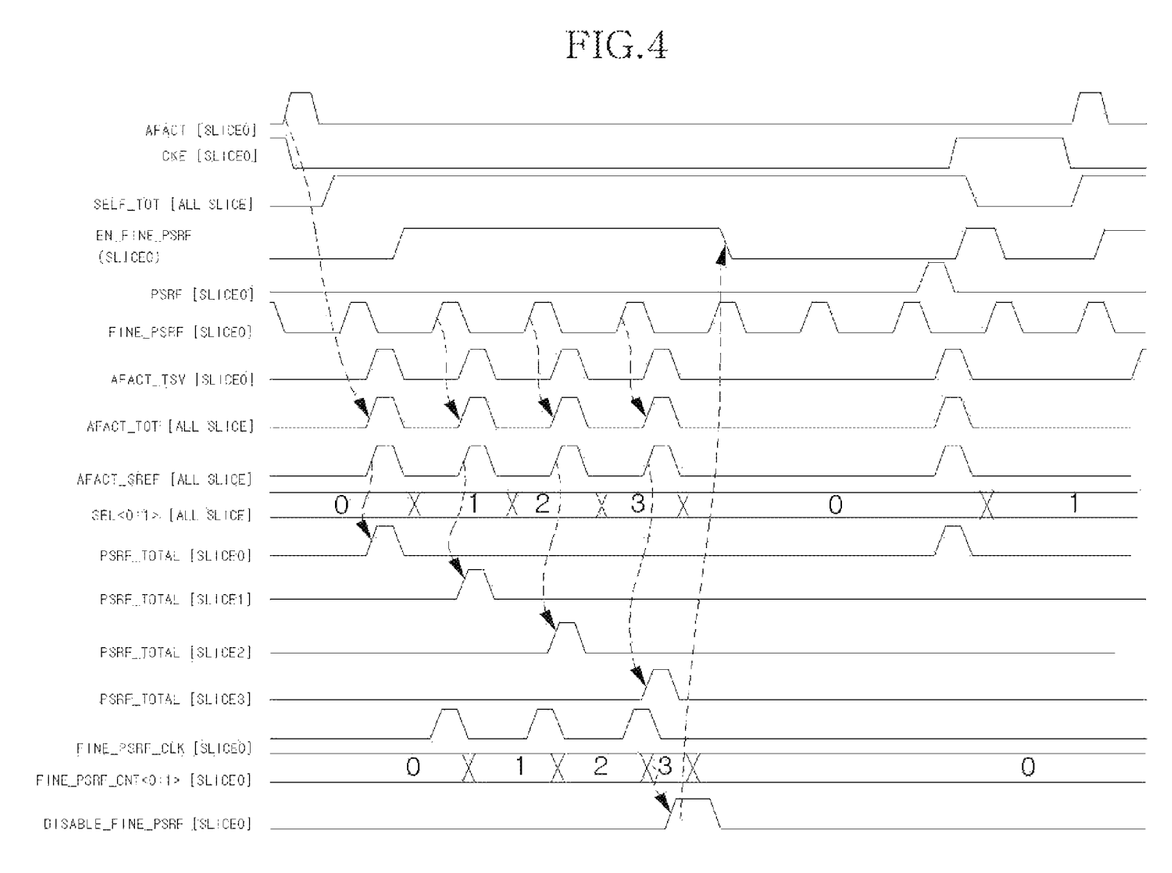
FIG. 4 is a diagram illustrating a representation of an example of the refresh control operation timing of the semiconductor apparatus in accordance with an embodiment.

Refresh control operations of the semiconductor apparatus 100 in accordance with an embodiment will be described below with reference to FIG. 4.

The refresh pulse AFACT or the first oscillation signal PSRF is a signal which defines the refresh cycle of a slice for which refresh is to be first performed, that is, a master slice, and the second oscillation signal FINE_PSRF is a signal which includes a plurality of pulses for defining the additional refresh cycle of slices for which refresh has not been first performed, among stacked slices.

The refresh pulse AFACT is generated according to the refresh command CMD in the master slice SLICE0.

If the clock enable signal CKE becomes the logic low (meaning the self refresh mode) at the same time when the refresh pulse AFACT is generated, the master slice SLICE0 generates the first self refresh pulse SELF_TSV and transmits the first self refresh pulse SELF_TSV to the slave slices SLICE1 to SLICE3 through the through-silicon vias TSV.

As the slave slices SLICE1 to SLICE3 receive the second self refresh pulse TSV_SELF, the refresh mode distinguishment signal SELF_TOT of all slices ALL SLICE becomes a logic high.

The oscillator 500 of the master slice SLICE0 generates the second oscillation signal FINE_PSRF in response to the refresh mode distinguishment signal SELF_TOT.

The master slice SLICE0 generates the first refresh cycle signal AFACT_TSV according to the refresh pulse AFACT and the second oscillation signal FINE_PSRF corresponding to the enable period of the oscillation enable signal EN_FINE_PSRF, and transmits the first refresh cycle signal AFACT_TSV to the slave slices SLICE1 to SLICE3 through the through-silicon vias TSV.

As the slave slices SLICE1 to SLICE3 receive the second refresh cycle signal TSV_AFACT, the internal refresh cycle signal AFACT_TOT is generated in all slices ALL SLICE.

In all slices ALL SLICE, the pre-signal AFACT_SREF is generated according to the internal refresh cycle signal AFACT_TOT.

In all slices ALL SLICE, the pre-signal AFACT_SREF is counted, and the count signals SEL<0:1> are generated.

The count signals SEL<0:1> increase, for example, like the following '00', '01', '10' and '11' ('0', '1', '2' and '3' on the decimal basis).

As aforementioned above, the slice IDs SLICE_ID<0:1>may be stored in such a manner that, for example, the lowermost master slice SLICE0 corresponds to '00' and the upper slave slices SLICE1 to SLICE3 respectively correspond to '01', '10' and '11'.

The master slice SLICE0 generates the self refresh start signal PSRF_TOTAL according to the first pulse of the pre-signal AFACT_SREF corresponding to '00' as the values of its slice IDs SLICE_ID<0:1>.

The slave slice SLICE1 generates the self refresh start signal PSRF_TOTAL according to the second pulse of the pre-signal AFACT_SREF corresponding to '01' as the values of its slice IDs SLICE_ID<0:1>.

The slave slice SLICE2 generates the self refresh start signal PSRF_TOTAL according to the third pulse of the pre-signal AFACT_SREF corresponding to '10' as the values of its slice IDs SLICE_ID<0:1>.

The slave slice SLICE3 generates the self refresh start signal PSRF_TOTAL according to the fourth pulse of the pre-signal AFACT_SREF corresponding to '11' as the values of its slice IDs SLICE_ID<0:1>.

The master slice SLICE0 counts the third pulse of the output signal FINE_PSRF_CLK of the second signal combination unit 620 of FIG. 3, that is, actually, the fourth pulse of the pre-signal AFACT_SREF, and generates the oscillation disable signal DISABLE_FINE_PSRF.

The master slice SLICE0 disables the oscillation enable signal EN_FINE_PSRF to a logic low according to the oscillation disable signal DISABLE_FINE_PSRF.

As the oscillation enable signal EN_FINE_PSRF is disabled to the logic low, the generation of the first refresh cycle signal AFACT_TSV in the master slice SLICE0 is interrupted.

Through the above-described process, refresh operations for all slices may be completed in synchronization with the respective pulses of the first refresh cycle signal AFACT_TSV generated by the master slice SLICE0.

The semiconductor apparatus and/or refresh control circuit discussed above (see FIGS. 1-4) are particular useful in the design of memory devices, processors, and computer systems. For example, referring to FIG. 5, a block diagram of a system employing the semiconductor apparatus and/or refresh control circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 5:
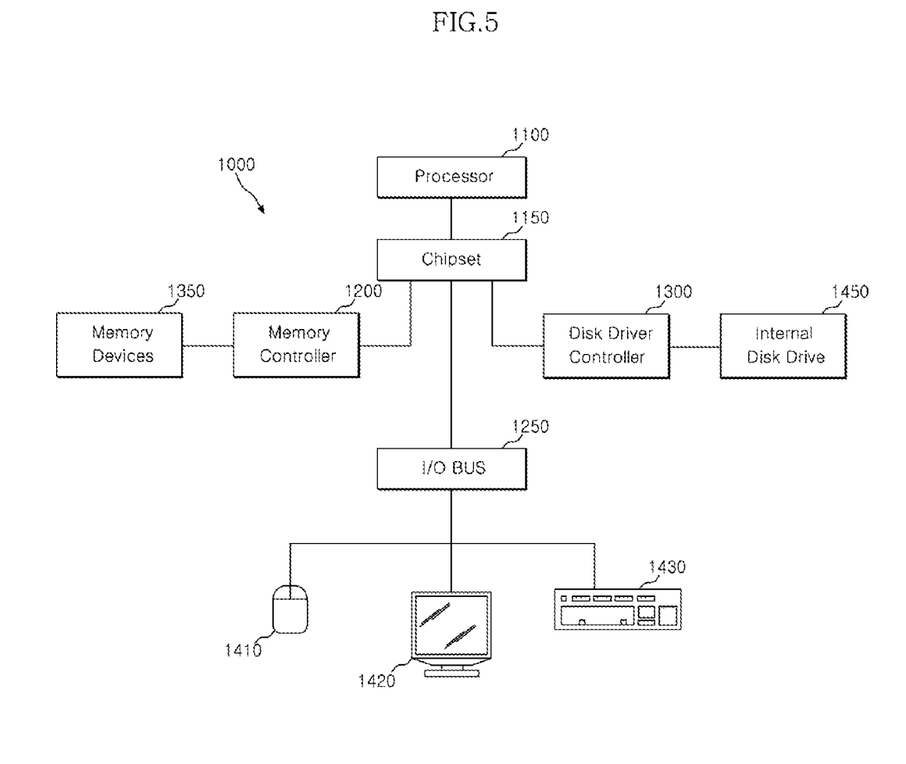
FIG. 5 illustrates a block diagram of an example of a representation of a system employing the semiconductor apparatus and/or refresh control circuit in accordance with the embodiments discussed above with relation to FIGS. 1-4.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus and/or refresh control circuit as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and/or refresh control circuit as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor apparatus and/or refresh control circuit as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the refresh control circuit and the semiconductor apparatus using the same described herein should not be limited based on the described embodiments.

What is claimed is:

1. A refresh control circuit comprising:
   an oscillator configured to generate oscillation signals in response to slice type distinguishment signals;
   a control block coupled to the oscillator, and configured to output a refresh cycle signal in response to a refresh command and the oscillation signals, and generate a refresh start signal in response to a slice matching signal, slice identities (IDs) and the refresh cycle signal; and
   a comparison block configured to determine whether slice addresses provided from the exterior of the refresh control circuit and the slice IDs correspond to each other, and generate the slice matching signal.

2. The refresh control circuit according to claim 1, wherein the control block comprises:
   a first signal combination unit configured to combine a refresh pulse and a first oscillation signal;
   a second signal combination unit configured to combine a second oscillation signal and an oscillation enable signal;
   an oscillation enable signal generation unit configured to generate the oscillation enable signal in response to an output of the first signal combination unit, an output of the second signal combination unit and a refresh mode distinguishment signal;
   a refresh cycle signal generation unit configured to generate a first pre-refresh cycle signal generated in response to the output of the first signal combination unit, the output of the second signal combination unit and a stack mode distinguishment signal or a second pre-refresh cycle signal received from an exterior of the refresh control circuit, as the refresh cycle signal; and
   a self refresh start signal generation unit configured to compare count signals resulting from counting the refresh cycle signal in response to the refresh mode distinguishment signal, with the slice IDs, and generate a self refresh start signal.

3. The refresh control circuit according to claim 2, wherein a cycle of the second oscillation signal is shorter than a cycle of the first oscillation signal.

4. The refresh control circuit according to claim 2, wherein the control block further comprises:
   an auto refresh start signal generation unit configured to generate an auto refresh start signal in response to the refresh mode distinguishment signal, the refresh cycle signal, and a slice matching signal.

5. A semiconductor apparatus comprising:
   a plurality of slices electrically coupled through through-hole electrodes,
   wherein any one slice of the plurality of slices is configured to generate a refresh cycle signal in response to a refresh command, and transmit the refresh cycle signal to the other slices through the through-hole electrodes, and
   wherein the other slices are configured to perform refresh operations at different timings according to a different pulse, corresponding to a comparison, among pulses of the refresh cycle signal,
   wherein the comparison is operated by comparing slice IDs with count signals resulting from counting the refresh cycle signal.

6. The semiconductor apparatus according to claim 5, wherein the any one slice is a master slice.

7. The semiconductor apparatus according to claim 5, wherein each of the plurality of slices comprises a refresh control circuit.

8. The semiconductor apparatus according to claim 7, wherein the refresh control circuit comprises:
   an oscillator configured to generate oscillation signals in response to slice type distinguishment signals;
   a multiplexing block configured to generate a refresh mode distinguishment signal in response to a stack mode distinguishment signal; and
   a control block coupled to the oscillator and the multiplexing block, and configured to output a refresh cycle signal in response to the refresh command and oscillation signals, and generate a refresh start signal in response to slice identities (IDs) and the refresh cycle signal.

9. The semiconductor apparatus according to claim 8, wherein the control block comprises:
a first signal combination unit configured to combine a refresh pulse and a first oscillation signal;
a second signal combination unit configured to combine a second oscillation signal and an oscillation enable signal;
an oscillation enable signal generation unit configured to generate the oscillation enable signal in response to an output of the first signal combination unit, an output of the second signal combination unit and the refresh mode distinguishment signal;
a refresh cycle signal generation unit configured to generate a first pre-refresh cycle signal which is generated in response to the output of the first signal combination unit, the output of the second signal combination unit and the stack mode distinguishment signal or a second pre-refresh cycle signal received from an exterior of the semiconductor apparatus, as the refresh cycle signal; and
a self refresh start signal generation unit configured to compare count signals resulting from counting the refresh cycle signal in response to the refresh mode distinguishment signal, with the slice IDs, and generate a self refresh start signal.

10. The semiconductor apparatus according to claim 9, wherein a cycle of the second oscillation signal is shorter than a cycle of the first oscillation signal.

11. The semiconductor apparatus according to claim 8, wherein the control block further comprises:
an auto refresh start signal generation unit configured to generate an auto refresh start signal in response to the refresh mode distinguishment signal, the refresh cycle signal and a slice matching signal.

12. The semiconductor apparatus according to claim 8, wherein the control block is configured to generate the refresh start signal in response to a slice matching signal.

13. The semiconductor apparatus according to claim 12, further comprising:
a comparison block configured to determine whether slice addresses provided from the exterior and the slice IDs correspond to each other, and generate the slice matching signal.

* * * * *